(12) United States Patent
Bierhuizen

(10) Patent No.: US 10,025,026 B2
(45) Date of Patent: Jul. 17, 2018

(54) LIGHTING DEVICE WITH LIGHT SOURCES POSITIONED NEAR THE BOTTOM SURFACE OF A WAVEGUIDE

(71) Applicant: Lumileds LLC, San Jose, CA (US)

(72) Inventor: Serge J. Bierhuizen, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/016,019

(22) Filed: Feb. 4, 2016

(65) Prior Publication Data

US 2016/0161668 A1 Jun. 9, 2016

Related U.S. Application Data

(63) Continuation of application No. 12/503,915, filed on Jul. 16, 2009, now Pat. No. 9,322,973.

(51) Int. Cl.
| | |
|---|---|
| *H01L 33/00* | (2010.01) |
| *F21V 8/00* | (2006.01) |
| *G02F 1/1335* | (2006.01) |
| *H01L 33/58* | (2010.01) |
| *H01L 33/60* | (2010.01) |

(Continued)

(52) U.S. Cl.
CPC ......... *G02B 6/0091* (2013.01); *G02B 6/0026* (2013.01); *G02B 6/0031* (2013.01); *G02B 6/0073* (2013.01); *G02F 1/133603* (2013.01); *G02F 1/133611* (2013.01); *H01L 33/486* (2013.01); *H01L 33/54* (2013.01); *H01L 33/58* (2013.01); *H01L 33/60* (2013.01); *G02B 6/002* (2013.01); *G02F 1/133605* (2013.01); *H01L 2933/005* (2013.01); *H01L 2933/0033* (2013.01); *H01L 2933/0058* (2013.01)

(58) Field of Classification Search
CPC .................................................... G02B 6/0091
USPC ........................................................... 257/98
See application file for complete search history.

(56) References Cited

U.S. PATENT DOCUMENTS

| 7,052,152 B2 | 5/2006 | Harbers et al. |
| 7,427,145 B2 | 9/2008 | Jang et al. |

(Continued)

FOREIGN PATENT DOCUMENTS

| CN | 1729501 A | 2/2006 |
| EP | 1729058 A1 | 12/2006 |

(Continued)

OTHER PUBLICATIONS

Agilent, "Light Guide Techniques Using LED Lamps", Application Brief I-003, Dec. 7, 2001, Agilent Technologies; pp. 1-21.

(Continued)

*Primary Examiner* — Ajay K Arora
(74) *Attorney, Agent, or Firm* — Volpe and Koenig, P.C.

(57) ABSTRACT

A device according to embodiments of the invention includes a waveguide, typically formed from a first section of transparent material. A light source is disposed proximate a bottom surface of the waveguide. The light source comprises a semiconductor light emitting diode and a second section of transparent material disposed between the semiconductor light emitting diode and the waveguide. Sidewalls of the second section of transparent material are reflective. A surface to be illuminated is disposed proximate a top surface of the waveguide. In some embodiments, an edge of the waveguide is curved.

20 Claims, 2 Drawing Sheets

(51) Int. Cl.
  *H01L 33/48*   (2010.01)
  *H01L 33/54*   (2010.01)

(56) References Cited

U.S. PATENT DOCUMENTS

| | | | |
|---|---|---|---|
| 7,631,991 | B2 | 12/2009 | Anderson et al. |
| 8,016,473 | B2 | 9/2011 | Salters et al. |
| 2003/0142500 | A1* | 7/2003 | Bachl ............... H01L 25/0753 362/373 |
| 2004/0072383 | A1 | 4/2004 | Nagahama et al. |
| 2005/0063187 | A1 | 3/2005 | Weng et al. |
| 2005/0212397 | A1 | 9/2005 | Murazaki et al. |
| 2005/0280756 | A1 | 12/2005 | Kim et al. |
| 2006/0102914 | A1 | 5/2006 | Smits et al. |
| 2006/0226800 | A1 | 10/2006 | Bruning |
| 2006/0268567 | A1 | 11/2006 | Jang et al. |
| 2006/0291238 | A1 | 12/2006 | Epstein et al. |
| 2007/0001185 | A1 | 1/2007 | Lu et al. |
| 2007/0267646 | A1 | 11/2007 | Wierer et al. |
| 2008/0123339 | A1 | 5/2008 | Bierhuizen et al. |
| 2009/0129058 | A1 | 5/2009 | Tokita et al. |
| 2009/0268279 | A1 | 10/2009 | Higuchi |
| 2011/0205750 | A1 | 8/2011 | Krijn et al. |

FOREIGN PATENT DOCUMENTS

| | | |
|---|---|---|
| JP | 10-212199 A | 8/1998 |
| JP | 10212199 A2 | 8/1998 |
| JP | 2005115372 A | 4/2005 |
| JP | 2005157025 A2 | 6/2005 |
| JP | 2006012818 A | 1/2006 |
| JP | 2006339151 A | 12/2006 |
| JP | 2007036044 A2 | 2/2007 |
| JP | 2007180021 A | 7/2007 |
| JP | 2007227168 A | 9/2007 |
| JP | 2008205511 A | 9/2008 |
| JP | 2008263235 A | 10/2008 |
| JP | 2008300298 A | 12/2008 |
| JP | 2009043738 A | 2/2009 |
| KR | 10-2007-0058532 A | 6/2007 |
| KR | 10-2008-0063231 A | 7/2008 |
| WO | 2007064002 A1 | 6/2007 |
| WO | 2009022284 A1 | 2/2009 |

OTHER PUBLICATIONS

TIPO, TW Application No. 099123013 filed Jul. 13, 2010, "Office Action dated Jul. 23, 2015", 5 pages.
EPO as ISA, PCT/IB2010/052855 filed Jun. 23, 2010, "International Search Report and Written Opinion" dated Jan. 11, 2011, 18 pages.
SIPO, CN Application No. 201080032004.8 filed Jun. 23, 2010, "Third Office Action dated Nov. 19, 2014", 9 pages.
JPO, JP Application No. 2012-520128 filed Jun. 23, 2010, "Office Action dated Oct. 23, 2015", 9 pages.
Preliminary Rejection dated Aug. 17, 2016, Korean Patent Application No. 10-2012-7003967, 7 pages.
SIPO First Office Action issued May 21, 2013, China Application No. 201080032004.8, 20 pages.
SIPO Grant Notification issued May 27, 2015, China Application No. 201080032004.8, 3 pages.
SIPO Second Office Action issued Mar. 11, 2014, China Application No. 201080032004.8, 17 pages.
JPO Office Action dated Jun. 13, 2017, Japan Application No. 2016-079485, 8 pages.
Notice of Preliminary Rejection from Korean Application No. 10-2017-7007513 dated Jul. 5, 2017, 12 pages.

* cited by examiner

LIGHTING DEVICE WITH LIGHT SOURCES POSITIONED NEAR THE BOTTOM SURFACE OF A WAVEGUIDE

This application is a continuation of U.S. application Ser. No. 12/503,915, filed on Jul. 16, 2009. U.S. Ser. No. 12/503,915 is incorporated herein by reference.

FIELD OF INVENTION

The present invention is directed to lighting devices including semiconductor light emitting diodes.

BACKGROUND

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE), or other epitaxial techniques. Often, an n-type region is deposited on the substrate, then a light emitting or active region is deposited on the n-type region, then a p-type region is deposited on the active region. The order of the layers may be reversed such that the p-type region is adjacent to the substrate.

One promising use of semiconductor light emitting devices is for backlights for general illumination and display devices such as liquid crystal displays (LCDs). Color or monochrome transmissive LCDs are commonly used in cellular phones, personal digital assistants, portable music players, laptop computers, desktop monitors, and television applications.

One example of a backlight where light is provided by LEDs is illustrated in FIG. 5 is described in U.S. Pat. No. 7,052,152. An array of LEDs 43 is placed on the rear panel of the backlight 45. The back plane 48 and sidewalls 46 of the backlight 45 are covered with highly reflective materials. A color converting phosphor layer 47 is disposed on a cover plate 40 of backlight 45. LCD panel 44 is placed in front of backlight 45. LCD panel 44 may be a conventional LCD, having a first polarizing filter, a thin film transistor array for developing an electric field across selected areas of the liquid crystal layer, a liquid crystal layer, an RGB color filter array, and a second polarizing filter. The color filter array has red, green and blue subpixels. Between the LCD panel 44 and the backlight 45, additional films are often used, such as a brightness enhancement film (BEF) or polarization recovery film (DBEF).

SUMMARY

It is an object of the invention to form a device with a light source disposed on the bottom surface of a solid, transparent waveguide. A device according to embodiments of the invention includes a waveguide, typically formed from a first section of transparent material. A light source is disposed proximate a bottom surface of the waveguide. The light source comprises a semiconductor light emitting diode and a second section of transparent material disposed between the semiconductor light emitting diode and the waveguide. Sidewalls of the second section of transparent material are reflective. A surface to be illuminated is disposed proximate a top surface of the waveguide. In some embodiments, an edge of the waveguide is curved.

Lighting devices according to embodiments of the invention may be thinner than conventional devices, with sufficient illumination, mixing, and uniformity.

DETAILED DESCRIPTION

Figure 5:
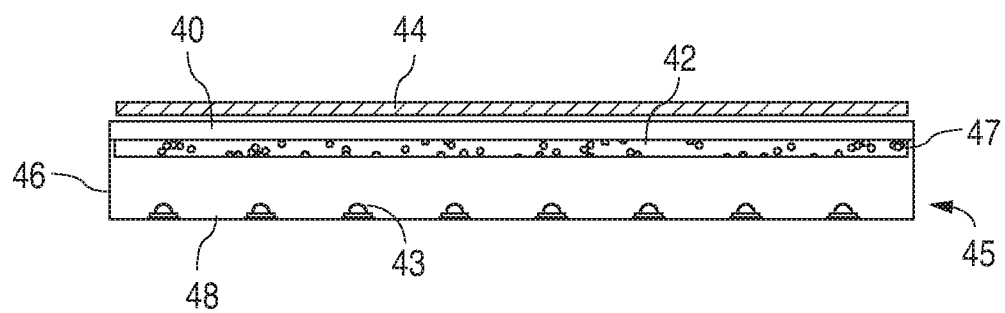
FIG. 5 is a cross sectional view of a backlight and an LCD.

The waveguide illustrated in FIG. 5, which is formed by back plate 48, sidewalls 46 and cover plate 40, must be thick, in order for the light incident on LCD 44 to be sufficiently mixed and uniform. Instead of an open, box-like waveguide as illustrated in FIG. 5, in embodiments of the invention, a solid waveguide is used. Light sources are positioned adjacent a bottom surface of the waveguide. Lighting devices according to embodiments of the invention may be thinner than the device illustrated in FIG. 5.

Figure 1:
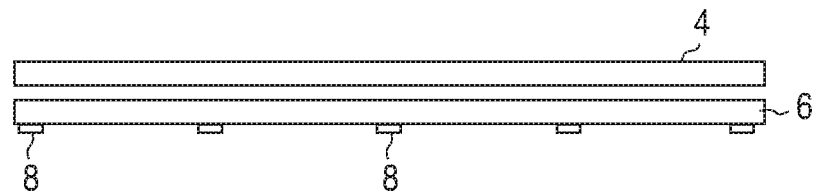
FIG. 1 illustrates an illumination system according to embodiments of the invention.

FIG. 1 illustrates a lighting device according to embodiments of the invention. Several light sources 8 are coupled to the bottom surface of waveguide 6. Waveguide 6 may be, for example, a section of transparent material that mixes light provided by several light sources. Waveguide 6 may be, for example, acrylic (e.g., PMMA), hard silicone, molded plastic, polycarbonate, or any other suitable material. Light from waveguide 6 is directed toward a surface to be illuminated. Though the embodiments below use the example of a liquid crystal display (LCD) panel 4 as the surface to be illuminated, the invention is not limited to LCD displays. The surface to be illuminated may be any surface including, in the case of a general lighting application, a simple transparent cover.

The surface to be illuminated may be a conventional LCD 4 having a first polarizing filter, a thin film transistor array for developing an electric field across selected areas of the liquid crystal layer, a liquid crystal layer, an RGB color filter array, and a second polarizing filter. The color filter array has red, green and blue subpixels. Between the LCD panel 4 and the waveguide 6, additional well-known films can be used, such as a brightness enhancement film or polarization recovery film, as well as a diffuser element to improve uniformity.

Figure 2:
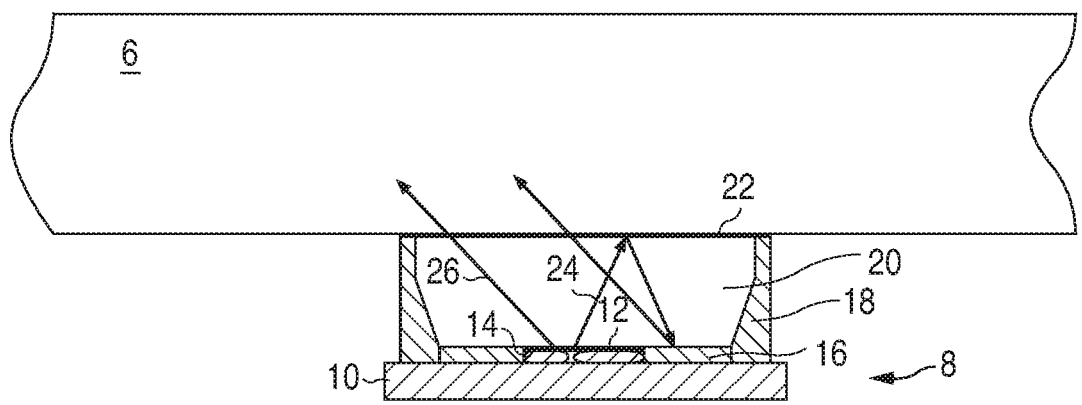
FIGS. 2 and 3 illustrate semiconductor light emitting devices connected to the bottom of waveguides.

FIG. 2 illustrates a first example of a light source 8 which is coupled to a bottom surface of waveguide 6. A semiconductor LED such as a blue- or UV-emitting III-nitride LED 12 is connected by interconnects 14 to a mount 10. LED 12 may be, for example, a thin-film flip-chip device.

A thin-film flip-chip III-nitride device may be formed by first growing an n-type region, a light emitting or active region, and a p-type region on a growth substrate, such as sapphire, SiC, or GaN. Portions of the p-type region and the light emitting region are etched to expose portions of the underlying n-type region. Metal electrodes which may be reflective, (e.g., silver, aluminum, or an alloy) are then formed on the exposed n- and p-type regions. When the diode is forward biased, the light emitting region emits light at a wavelength determined by the composition of the III-nitride active layer. Forming such LEDs is well known.

The semiconductor LED 12 is then mounted on a mount 10 as a flip chip. Mount 10, may be any suitable material such as, for example, ceramic, aluminum, or silicon. Mount 10 includes metal electrodes that are soldered or ultrasonically welded to the metal electrodes on the semiconductor structure via interconnects, which may be, for example, gold or solder. Interconnects may be omitted if the electrodes themselves can be connected, for example by an ultrasonic weld or any other suitable joint. The multiple metal layers between the semiconductor layers 12 and mount 10, including electrodes on the semiconductor, electrodes on the mount, and interconnects, are shown in FIG. 2 as structure 14. Mount 10 acts as a mechanical support, provides an electrical interface between the n- and p-electrodes on the LED chip and a power supply, and provides heat sinking. Suitable mounts are well known.

To reduce the thickness of the LED and to prevent light from being absorbed by the growth substrate, the growth substrate is removed by a method suitable to the substrate, such as etching, chemical-mechanical polishing, or laser melting, where a laser heats the interface of the III-nitride structure and growth substrate, melting a portion of the III-nitride structure and releasing the substrate from the semiconductor structure. In one embodiment, removal of the growth substrate is performed after an array of LEDs are mounted on a mount wafer and prior to the LEDs/mounts being singulated (e.g., by sawing).

After the growth substrate is removed, in some embodiments the remaining III-nitride structure is thinned and/or roughened or patterned, for example with a photonic crystal. The photonic crystal may be designed to maximize emission into large angles relative to a normal to a top surface of the device, for example. In some embodiments the photonic crystal is configured such that the >50% of energy is emitted at angles >45° relative to a normal to a top surface of the device. The device may be covered with an encapsulating material. In some embodiments, the growth substrate remains a part of the device. The growth substrate may be coated with a reflective coating, such that a majority of light is emitted into large angles relative to a normal to a top surface of the device. A wavelength converting material such as one or more phosphors may be formed over the semiconductor structure.

A cavity 20 separates LED 12 from waveguide 6. The sides 18 and bottom 16 of the cavity adjacent to LED 12 are reflective. The cavity 20 may be filled with transparent material such as, for example, silicone. A dichroic filter layer 22 is disposed between waveguide 6 and cavity 20. The dichroic filter layer 22 may be configured such that blue light emitted by the LED 12 at small angles, such as ray 24, is reflected, while blue light emitted by the LED 12 at large angles, such as ray 26, is transmitted. Suitable dichroic filters are well known and available from, for example, Ocean Optics, 830 Douglas Ave. Dunedin, Fla. 34698.

The device illustrated in FIG. 2 may be formed by first forming the thin film flip chip LED 12 mounted on mount 10. The reflective sidewalls 18 and reflective bottom 16 of cavity 20 are then formed. For example, a reflective material such as, for example, $TiO_2$ may be disposed in a moldable material such as, for example, silicone, then molded on mount 10 to form the reflective sidewalls 18 and bottom 16. Alternatively, sidewalls 18 and bottom 16 may be prefabricated a rigid material, coated with a reflective material if the rigid material itself is not reflective, then positioned on mount 10. Cavity 20 is then filled with a transparent material. Dichroic filter layer 22 is then coated over the transparent material in cavity 20.

Figure 3:
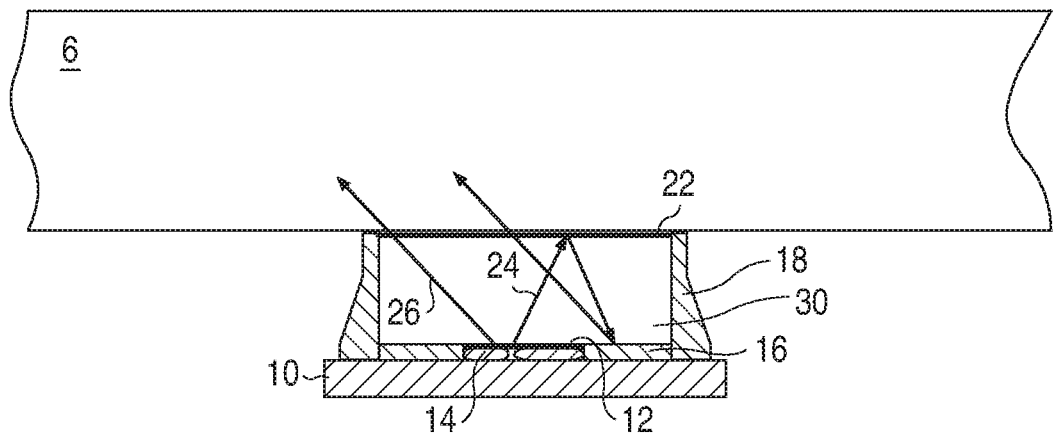

FIG. 3 illustrates a second example of a light source 8 which is coupled to a bottom surface of waveguide 6. Semiconductor LED 12 may be a III-nitride thin film flip chip connected by interconnects 14 to a mount 10, as described above. As in the device of FIG. 2, a cavity is formed by reflective sidewalls 18. The portion of the bottom 16 of the cavity that is not occupied by LED 12 is made reflective. A solid transparent material 30 such as glass occupies the cavity formed by reflective sidewalls 18 and bottom 16. A dichroic filter layer 22, which reflects light 24 and transmits light 26, as described above, is disposed over transparent material 30.

The device illustrated in FIG. 3 may be formed by first forming the thin film flip chip LED 12 mounted on mount 10, as described above. Separately, a transparent material 30 such as a glass plate is coated with dichroic filter layer 22 diced to the desired size, before or after forming dichroic filter layer 22. Transparent material 30 is attached to LED 12, for example by gluing with transparent epoxy or silicone. Reflective sidewalls 18 and bottom 16 are then formed by coating the sides and bottom of transparent material 30 with, for example, a reflective metal such as silver or aluminum, reflective paint, a reflective coating, or a reflective material such as $TiO_2$ disposed in a binder such as, for example, silicone. The sides of transparent material 30 may be coated with a reflective material before transparent material 30 is attached to LED 12. A vacuum may be used to draw reflective material in a binder into the spaces between transparent material 30 and mount 10, or the binder may be selected to wick under transparent material 30, in order to form reflective bottoms 16. In some embodiments, mount 10 is reflective.

In some embodiments, in the devices illustrated in FIGS. 2 and 3, LED 12 may have a lateral extent, in the dimension illustrated, of between several hundred microns and one or two millimeters. The space filled with transparent material may have a lateral extent, in the dimension illustrated, of between for example 1.1 and 2 times the lateral extent of LED 12, and a height of between for example 0.5 and 1.5 times the lateral extent of LED 12. In one example, LED 12 is 1 mm long, mount 10 is 2 mm long, and transparent material 30 is 1.5 mm long and 1 mm tall.

Figure 4:
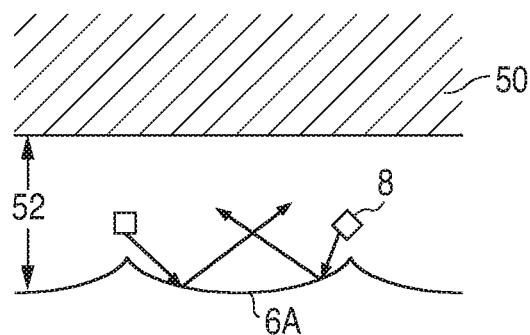
FIG. 4 is a top view of a portion of a waveguide.

In some embodiments, the edge 6A of waveguide 6 is shaped to direct light toward the area of the waveguide underlying the surface to be illuminated, as illustrated in FIG. 4, which is a top view of a portion of the waveguide. Squares 8 illustrate the locations of light sources, which may be the light sources illustrated in FIGS. 2 and 3. Edge 6A includes multiple curved portions, which may be coated with a reflective material or which may be shaped to cause total internal reflection of light emitted by light sources 8 toward edge 6A. The edge 6A may be scalloped, as illustrated in FIG. 4, or may have another shape. The light is directed toward active viewing area 50 of the display. Shaping the edges of waveguide 6 may reduce the amount of light lost to absorption by the LEDs by directing light incident on the waveguide edge away from the LEDs instead of back toward the LEDs. Shaping the edges of waveguide 6 may also improve the uniformity of light in the active viewing area 50, may reduce the number of LEDs required for a given display performance, and may reduce the bezel height 52, which is the distance between the edge of the waveguide and the edge of the active viewing area 50.

Light sources 8 may be positioned at even intervals across the bottom of waveguide 6, only near the edge of waveguide 6, or in any other configuration. In some embodiments, some light sources emit blue light, some emit green light, and some emit red light. The red, green, and blue light combines in waveguide 6 to form white light. In some embodiments, each light source emits white light, for example by wavelength converting some light emitted by a blue-emitting LED such that the wavelength converted light and the blue light combine to form white light. For example, a yellow-emitting phosphor may be combined with a blue-emitting LED to form white light, or a red-emitting phosphor and a green-emitting phosphor may be combined with a blue-emitting LED to form white light. Additional phosphors or other wavelength-converting materials that emit light of other colors may be added to achieve a desired color point. The phosphors may be disposed directly on LED 12 of FIGS. 2 and 3, or between dichroic filter layer 22 and transparent material 20 or 30, or between dichroic filter layer 22 and waveguide 6. In some embodiments, one or more remote phosphors may be disposed over waveguide 6 in the active viewing area 50 of the display, illustrated in FIG. 4.

In a lighting system as described above where light is provided by several light sources, performance may be measured by whether the design provides sufficient illumination, mixing, and uniformity of the light. Embodiments of the invention may provide sufficient illumination, mixing, and uniformity with fewer light sources, as compared to lighting systems that do not incorporate features of the embodiments. In some applications, such as backlights for displays, it is desirable to minimize the thickness of lighting system. Embodiments of the invention may provide the same performance in a thinner lighting system, as compared to lighting systems that do not incorporate features of the embodiments.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a waveguide;
   light sources disposed proximate a bottom surface of the waveguide, each light source comprising:
      a laterally emitting light emitting diode (LED) that emits a majority of light into large angles relative to a normal to a top surface of the laterally emitting LED;
      a cavity separating the laterally emitting LED from the waveguide;
      a transparent material disposed within or defining the cavity; and
      a dichroic filter disposed between the waveguide and the cavity.

2. The device of claim 1, further comprising a surface to be illuminated disposed proximate a top surface of the waveguide.

3. The device of claim 1, wherein the cavity is defined by sidewalls and a bottom, the bottom of the cavity surrounding the laterally emitting LED, the sidewalls and the bottom of the cavity comprising a reflective material or the reflective material is disposed on the sidewalls and the bottom of the cavity.

4. The device of claim 3, wherein the reflective material comprises $TiO_2$ disposed in a transparent binder material.

5. The device of claim 1, wherein the cavity is defined by sidewalls and a bottom, the bottom of the cavity surrounding the laterally emitting LED, the sidewalls and the bottom of the cavity comprising a reflective material coated on sides and a bottom of the transparent material.

6. The device of claim 1, wherein the transparent material is one of glass and silicone.

7. The device of claim 1, wherein an edge of the waveguide is shaped to direct light toward a portion of a top surface of the waveguide.

8. The device of claim 7, wherein the edge of the waveguide is curved.

9. The device of claim 7, wherein the edge of the waveguide is shaped to cause total internal reflection of light incident on the edge.

10. The device of claim 1, further comprising a wavelength converting material disposed between the waveguide and the laterally emitting LED.

11. The device of claim 1, wherein the transparent material has a length greater than a length of the laterally emitting LED.

12. The device of claim 1, wherein the laterally emitting LED comprises a photonic crystal configured such that over 50% of energy emitted by the laterally emitting LED is emitted at angles greater than 45° relative to a normal to the top surface of the laterally emitting LED.

13. The device of claim 1, wherein the laterally emitting LED comprises:
    a sapphire growth substrate; and
    a reflective coating disposed on the sapphire growth substrate.

14. A method, comprising:
    forming a cavity in which a laterally emitting light emitting diode is disposed;
    disposing a dichroic filter between a waveguide and the cavity; and
    disposing the cavity containing the laterally emitting LED proximate a bottom surface of the waveguide.

15. The method of claim 14, wherein forming the cavity comprises molding sidewalls and a bottom of the cavity comprising a reflective material or molding the sidewalls and the bottom of the cavity without the reflective material and disposing the reflective material on the sidewalls and the bottoms of the cavity.

16. The method of claim 14, wherein the cavity is defined by sidewalls and a bottom, the bottom of the cavity surrounding the laterally emitting LED, and forming the cavity comprises gluing a glass plate to the laterally emitting LED and coating sides and a bottom of the glass plate with a reflective material.

17. The method of claim 14, further comprising shaping an edge of the waveguide to direct light toward a portion of a top surface of the waveguide.

18. The method of claim 14, further comprising disposing a wavelength converting material between the waveguide and the laterally emitting LED.

19. The method of claim 14, wherein the laterally emitting LED comprises a photonic crystal configured such that over 50% of energy emitted by the laterally emitting LED is emitted at angles greater than 45° relative to a normal to the top surface of the laterally emitting LED.

20. The method of claim 14, wherein the laterally emitting LED comprises:
    a sapphire growth substrate; and a reflective coating disposed on the sapphire growth substrate.

* * * * *